United States Patent
Gilbert

(10) Patent No.: US 10,256,358 B2
(45) Date of Patent: Apr. 9, 2019

(54) DEVICE FOR IMPROVING THE QUALITY OF AN IMAGE COVERED WITH A SEMITRANSPARENT PHOTOVOLTAIC FILM

(71) Applicant: SUNPARTNER TECHNOLOGIES, Aix en Provence (FR)

(72) Inventor: Joël Gilbert, Eguilles (FR)

(73) Assignee: SUNPARTNER TECHNOLOGIES, Aix en Provence (FR)

( * ) Notice: Subject to any disclaimer, the term of this patent is extended or adjusted under 35 U.S.C. 154(b) by 0 days.

(21) Appl. No.: 14/413,098

(22) PCT Filed: Jul. 4, 2013

(86) PCT No.: PCT/FR2013/000174
§ 371 (c)(1),
(2) Date: Jan. 6, 2015

(87) PCT Pub. No.: WO2014/006282
PCT Pub. Date: Jan. 9, 2014

(65) Prior Publication Data
US 2015/0214406 A1    Jul. 30, 2015

(30) Foreign Application Priority Data

Jul. 6, 2012  (FR) ..................................... 12 01927

(51) Int. Cl.
*G09F 13/14*  (2006.01)
*H02S 40/20*  (2014.01)
(Continued)

(52) U.S. Cl.
CPC .......... *H01L 31/0468* (2014.12); *G09F 13/14* (2013.01); *H01L 31/048* (2013.01);
(Continued)

(58) Field of Classification Search
CPC . H01L 31/054; H01L 31/048; H01L 31/0547; H01L 31/0468; G09F 13/00;
(Continued)

(56) References Cited

U.S. PATENT DOCUMENTS 3,990,100 A * 11/1976 Mamine ............ H01L 31/02161
136/256
5,101,260 A * 3/1992 Nath ................... H01L 31/0236
136/249

(Continued)

FOREIGN PATENT DOCUMENTS

FR  2 896 596 A1  7/2007
JP  11-296636 A    10/1999

(Continued)

OTHER PUBLICATIONS

International Search Report (PCT/ISA/210) dated Oct. 7, 2013, by the European Patent Office as the International Searching Authority for International Application No. PCT/FR2013/000174.

*Primary Examiner* — Lindsey A Bernier
(74) *Attorney, Agent, or Firm* — Buchanan Ingersoll & Rooney PC

(57) ABSTRACT

Problem addressed: how to decrease the loss of visual quality in an image that appears when this image is placed behind a semitransparent photovoltaic sheet or film. Solution: on the one hand, increase the luminosity of the image by depositing a white-colored or metallic or reflective layer on the side of the photovoltaic cells that is turned towards the image; and on the other hand, by modifying the luminosity, the contrast, and the color saturation of the image.

8 Claims, 1 Drawing Sheet

(51) Int. Cl.
*H02S 40/22* (2014.01)
*H01L 31/048* (2014.01)
*H01L 31/054* (2014.01)
*H01L 31/0468* (2014.01)

(52) U.S. Cl.
CPC ........ H01L 31/054 (2014.12); H01L 31/0547 (2014.12); H02S 40/20 (2014.12); H02S 40/22 (2014.12); *Y02E 10/50* (2013.01); *Y02E 10/52* (2013.01)

(58) Field of Classification Search
CPC .......... G09F 13/14; H02S 40/20; H02S 40/22; Y02E 10/50
USPC ................................ 136/244, 251, 252, 259
See application file for complete search history.

(56) References Cited

U.S. PATENT DOCUMENTS

| | | | |
|---|---|---|---|
| 6,133,521 A * | 10/2000 | Haga | ................. H01L 31/02008 |
| | | | 136/251 |
| 6,791,905 B1 * | 9/2004 | Sekiguchi | .............. G04B 19/12 |
| | | | 368/205 |
| 2003/0227435 A1 * | 12/2003 | Hsieh | ................... G09G 3/3406 |
| | | | 345/102 |
| 2005/0172997 A1 * | 8/2005 | Meier | .................... H01L 31/056 |
| | | | 136/261 |
| 2007/0277810 A1 | 12/2007 | Stock | |
| 2011/0063729 A1 | 3/2011 | Gilbert | |

FOREIGN PATENT DOCUMENTS

| | | |
|---|---|---|
| JP | 2008-072004 A | 3/2008 |
| WO | WO 2005/071760 A1 | 8/2005 |

* cited by examiner

DEVICE FOR IMPROVING THE QUALITY OF AN IMAGE COVERED WITH A SEMITRANSPARENT PHOTOVOLTAIC FILM

The present invention relates to the field of images which are covered with a semitransparent photovoltaic film.

PRIOR ART

Devices which produce photovoltaic electricity on the surface of an image generally use a semitransparent photovoltaic sheet laid onto or adhered to the surface of the image.

This photovoltaic sheet is made up of a transparent sheet on which narrow, parallel photovoltaic strips have been deposited, separated by a distance which is a function of the desired transparency. Thus, the greater this distance, the lower the level of cover of the photovoltaic layer and therefore the greater the transparency. Conversely, the shorter the distance between the photovoltaic strips, the greater the level of cover, resulting in a lower transparency. The lower the transparency, the more the image loses in terms of luminosity.

Since the production of electricity which is generated by the sheet is proportional to the photovoltaic surface, it is expedient to increase this surface, but without exceeding a threshold which is a function of the admissible degradation of the luminosity of the image. This compromise between the aim of achieving maximum electrical production and a minimal reduction in the luminosity of the image is subjective, since it depends on the characteristics of the image, the ambient luminosity and the visual perception of the observer.

It can be demonstrated that there is a minimum of loss of luminosity when the photovoltaic layers are closest to the image, i.e. with no space between the image and the opaque photovoltaic layers. However, some configurations require a distance between the image and the photovoltaic sheet, as is the case with rotating publicity advertisements in which the images are mobile in relation to the glazed sheet and must therefore remain distant from the sheet in order to avoid an electrostatic attraction and premature wear due to friction.

Devices are also known which associate photovoltaic strips with a plurality of nested images in order to create a visual effect of an image in relief using the parallax barrier technique. In these different cases, the images can be of any type, including electronic images. The photovoltaic layers can also be of any type, made from crystalline or amorphous silicon, or may be made up of multiple photosensitive layers such as CIGS.

OBJECT OF THE INVENTION

The arrangement of a semitransparent sheet on an image causes a reduction in its luminosity. In fact, the quantity of light that illuminates the image is reduced by the photovoltaic strips which form an obstacle and which absorb a part of the incident light. When the image and the photovoltaic sheet are distant from one another, therefore not adhered to one another, a part of the light that is emitted by the image is itself stopped by the photovoltaic cells, which further reduces the apparent luminosity of the image.

The object of the invention is to reduce the shading effect of photovoltaic cells while retaining the same photovoltaic surface, which will enable the same electrical power to be retained and the luminosity of the image, i.e. its visual quality, to be increased.

The invention will also make it possible to increase the surface of the photovoltaic cells in a different manner, while retaining the same luminosity, i.e. the visual quality of the image.

SUMMARY OF THE INVENTION

The term "photovoltaic sheet" also includes "photovoltaic films" which are thin and flexible photovoltaic sheets.

The term "image" includes all images printed on any medium and electronic images which use ambient light only, and also the surface of any "object", this surface making up an image which can have any given form.

The device which forms the subject-matter of the invention is made up of an image on which a semitransparent photovoltaic sheet is positioned. The image may be a printed image or an electronic image, for example an LCD image, or an image made up of pixels backlit by mirrors, or the colored surface of any given object, flat or otherwise, such as a wall, tile or table.

The semitransparent photovoltaic sheet is a transparent sheet, made from rigid or flexible, flat or curved crystalline glass or organic glass, on which crystalline or amorphous photovoltaic cells have been arranged, such as, for example, silicon, or a stacking of thin photosensitive and photovoltaic layers, such as, for example CIGS, or organic cells. These cells may be opaque or semitransparent. They are distributed on the surface of the transparent sheet to form opaque areas separated by transparent areas, or they are distributed in the form of networks of geometric figures such as, for example, rectangular and parallel strips separated by transparent strips.

These photovoltaic cells have two sides, one of which is turned toward the image or toward the object. This side turned toward the image or toward the object is covered with a highly light-reflective layer, such as, for example, an ink or white paint or a mirror-effect aluminum or chrome metal deposit. For example, the sides of the photovoltaic cells turned toward the image are suitable for reflecting more than 30% of the light which they receive. This reflective side is separated from the image or from the surface of the object by a non-zero distance. The space thus created between the reflective side of the photovoltaic cells and the image may comprise air or a transparent material such as crystalline glass or organic glass.

The image and the sheet which covers it are illuminated by an incident light, one part of which is intercepted by the photovoltaic cells and another part of which crosses the transparent areas and illuminates the image. Each pixel of the image then diffuses this light in all directions. This light diffused by the image either crosses the transparent areas again as far as the observer, or is reflected by the reflective sides of the photovoltaic cells, or is reflected in the transparent areas when two conditions are satisfied: the refractive index of the space between the cells and the image is greater than air, and the angle of incidence of the light ray is greater than the critical angle of the total reflection in the transition from a high-index diopter to a low-index diopter.

In the case where the light diffused by the image is reflected, said light is reflected again toward the image which will reflect it once more. As a result, the light diffused by the image which will pass from the sheet to the observer will be greater in intensity than it would have been if the internal sides of the cells had not been reflective. The observer will therefore see a more luminous image than if the internal sides of the cells had remained absorbent and non-reflective.

In one particular embodiment of the invention, and still in order to increase the luminosity emitted by the image and compensate for the loss of light absorbed by the photovoltaic cells, the device is associated with means for modifying the original image, notably in its brightness, contrast and color saturation characteristics. In fact, the image receives less light since a part of said light is stopped by the photovoltaic cells. The observer will therefore see an image which is darker, less bright than the original image. In order to partially correct this disadvantage, the original digital image undergoes a computer processing which consists in increasing the luminosity of all or some of its pixels. The percentage of this luminosity increase will be a function of the characteristics of the original image and the percentage of shading of the photovoltaic cells. In particular, the means for modifying the luminosity of the image are adjusted in order to increase the luminosity of the image by a percentage equal to or greater than the percentage of cover of the photovoltaic cells on the sheet.

The same will apply to the contrast and color saturation which will be modified so that the vision of the observer most closely approximates the vision of the original image. The image covered with the photovoltaic sheet will thus produce electricity with a minimum of visual degradation.

DETAILED DESCRIPTION OF THE INVENTION

The invention will now be described in more detail through the description of the indexed FIGS. 1 and 2.

Figure 1:
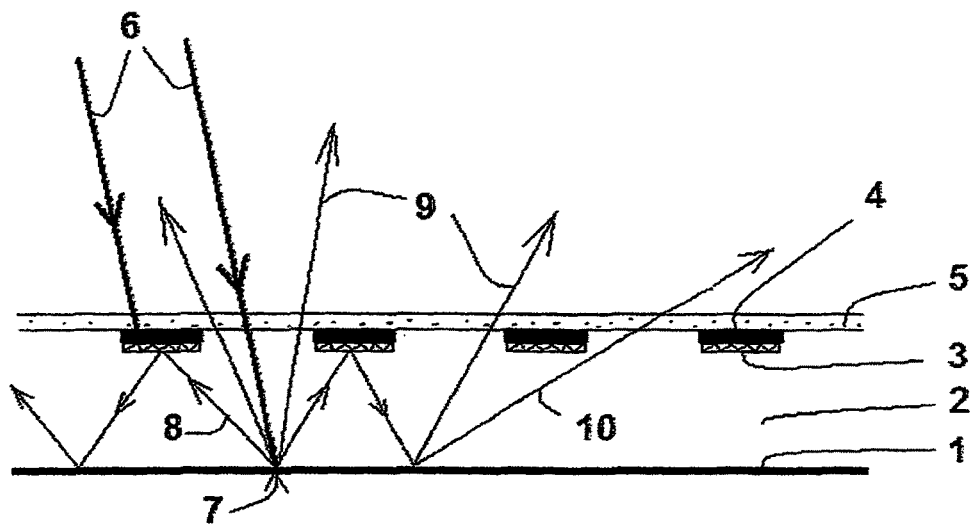
FIG. 1 is a schematic diagram in cross-section of the device according to the invention.

The device forming the subject-matter of the invention (FIG. 1) is made up of an image (7) on which a semitransparent photovoltaic sheet is positioned. The image (7) may be a printed image or an electronic image, for example an LCD image, or an image made up of pixels backlit by mirrors, or the colored surface of any given object, flat or otherwise, such as a wall, tile or table.

The semitransparent photovoltaic sheet is a transparent sheet (5) made from rigid or flexible, flat or curved crystalline glass or organic glass, on which crystalline or amorphous photovoltaic cells (4) have been arranged, such as, for example, silicon, or a stacking of thin photosensitive and photovoltaic layers, such as, for example CIGS, or organic cells. These cells (4) may be opaque or semitransparent. They are distributed on the surface of the transparent sheet (5) to form opaque areas separated by transparent areas, or they are distributed in the form of networks of geometric figures such as, for example, rectangular and parallel strips separated by transparent strips.

Figure 2:
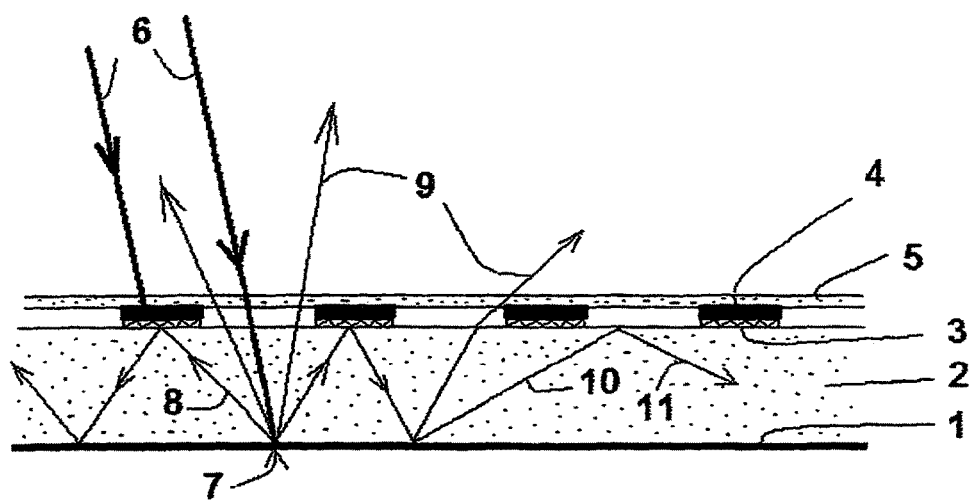
FIG. 2 is a schematic diagram in cross-section of a variant of the device with a space with a high refractive index between the cells and the image.

The photovoltaic cells (4) have two sides, one of which is turned toward the image or toward the object. This side turned toward the image or toward the object is covered with a highly light-reflective layer (3), such as, for example, an ink or white paint or a mirror-effect aluminum or chrome metal deposit. This reflective side (3) is separated from the image (1) or from the surface of the object (1) by a non-zero distance. The space (2) thus created between the reflective side (3) of the photovoltaic cells and the image (1) may comprise air or a transparent material (FIG. 2) such as crystalline glass or organic glass, the refractive index of which is greater than 1.

The image (1) and the cells (4) which cover it are illuminated by an incident light (6), one part of which is intercepted by the photovoltaic cells (4) and another part of which crosses the transparent areas and illuminates the image (1). Each pixel (7) of the image then diffuses this light in all directions (8, 9, 10). This light diffused by the image either crosses the transparent areas again as far as the observer (9), or is reflected by the reflective sides (3) of the photovoltaic cells (4), or is reflected (10, 11) in the transparent areas (FIG. 2) when two conditions are satisfied: the refractive index of the space (2) between the cells (4) and the image (1) is greater than air, and the angle of incidence of the light ray (10—FIG. 2) is greater than the critical angle of the total reflection in the transition from a high-index diopter to a low-index diopter.

In the case where the light diffused (10—FIG. 2) by the image is reflected (11), said light is reflected again toward the image (1) which will reflect it once more. As a result, the light diffused by the image (1, 7) which will pass from the sheet to the observer will be greater in intensity than it would have been if the internal sides of the cells (4) had not been reflective (3). The observer will therefore see a more luminous image (1) than if the internal sides of the cells (4) were absorbent or non-reflective.

In one particular embodiment of the invention (not shown), and still in order to increase the luminosity emitted by the image (1) and compensate for the loss of light absorbed by the photovoltaic cells (4), the original image (1) is modified notably in its brightness, contrast and color saturation characteristics. In fact, the image (1) receives less light since a part of said light is stopped by the photovoltaic cells (4). The observer will therefore see an image which is darker, less bright than the original image. In order to partially correct this disadvantage, the original digital image undergoes a computer processing which consists in increasing the luminosity of all or some of its pixels. The percentage of this increase in luminosity will be a function of the characteristics of the original image and the percentage of shading of the photovoltaic cells. The same will apply to the contrast and color saturation which will be modified so that the vision of the observer most closely approximates the vision of the original image. The image (1) covered with the photovoltaic sheet (5) will thus produce electricity with a minimum of visual degradation.

A specific example embodiment will now be described.

The device according to the invention includes a one-meter-sided, square paper image (1) and a glass sheet (5) having the same dimensions and a thickness of 4 mm, on which a network of parallel strips of thin photovoltaic layers (4) made from amorphous silicon have been deposited, of which the width is 1 mm and the distance separating them is 3 mm.

The photovoltaic strips (4) are covered on one of the sides (3) with a thin-layer, aluminum deposit which has the property of reflecting more than 60% of the light which it receives. This side (3) which is covered with a reflective layer is turned toward the image (1) and covers it. The distance between the photovoltaic sheet and the image is 1 cm. This space (2) contains air only. The level of cover of the photovoltaic material on the surface of the sheet is 25%. The digital image has been modified before its paper printout (1) by increasing its luminosity by 30% and reducing its contrast by 5%. Thus, the observer looking at the image (1) through the photovoltaic sheet (5) will see an image which has lost very little of its original luminosity. The photovoltaic sheet (5) will produce around 15 watts of electrical power in full sunlight while reproducing an image very similar to the original image.

ADVANTAGES OF THE INVENTION

Ultimately, the invention achieves the defined objects. It is particularly suitable for covering an image or an object with a semitransparent photovoltaic sheet or film while reducing the visual degradation of the image.

The invention claimed is:

1. A device comprising:
    an image configured to be illuminated by incident light and to reflect at least a part of said light; and
    a photovoltaic sheet arranged adjacent to a surface of the image that receives the incident light, said photovoltaic sheet being arranged at a non-zero distance above the surface of the image and including (i) luminous transparent areas and (ii) areas covered with photovoltaic cells, one side of the photovoltaic cells being oriented toward the image and configured to receive the part of said light reflected by said image,
    wherein the entire non-zero distance between the photovoltaic sheet and the surface of the image consists of one of (i) only air and (ii) only a transparent solid material, and
    wherein said one side of the photovoltaic cells oriented toward the image (i) is white in color, and (ii) increases a luminosity of said image seen by an observer through the transparent areas by reflecting more than 30% of the part of the light it receives, as reflected by said image, back toward the image.

2. The device as claimed in claim 1, wherein the photovoltaic sheet is flexible and/or has a thickness that is smaller in comparison with its length.

3. The device as claimed in claim 1, wherein the photovoltaic sheet is made from crystalline glass or organic glass.

4. The device as claimed in claim 1, wherein the photovoltaic cells are made from crystalline and/or amorphous or organic silicon or are made up of a plurality of photovoltaic layers, wherein each photovoltaic layer of the plurality of photovoltaic layers has a thickness that is smaller in comparison with its length.

5. The device as claimed in claim 1, wherein the photovoltaic cells form a network of strips parallel to one another and separated by transparent strips.

6. The device as claimed in claim 1, wherein the transparent solid material has a refractive index greater than 1.

7. The device as claimed in claim 1, wherein the device comprises a processing device configured to modify the luminosity of the image and/or the contrast of the image and/or the color saturation of the image in such a way as to visually compensate for the degradation of the image due to the superposition of the photovoltaic sheet adjacent the surface of the image that receives the incident light.

8. The device as claimed in claim 7, wherein the processing device is configured to increase the luminosity of the image by a percentage equal to or greater than the percentage of cover of the photovoltaic cells on the photovoltaic sheet.

* * * * *